United States Patent [19]

Buck et al.

[11] Patent Number: 4,543,497

[45] Date of Patent: Sep. 24, 1985

[54] ELECTRONIC MONITORING SYSTEM WITH SELECTIVE SIGNAL INVERSION

[75] Inventors: Robert Buck, Neukirch; Jean L. Lamarche, Langenargen, both of Fed. Rep. of Germany

[73] Assignee: IFM Electronic GmbH, Essen, Fed. Rep. of Germany

[21] Appl. No.: 487,123

[22] Filed: Apr. 21, 1983

[30] Foreign Application Priority Data

Apr. 21, 1982 [DE] Fed. Rep. of Germany ....... 3214836

[51] Int. Cl.⁴ .............................................. H03K 3/26
[52] U.S. Cl. .................................... 307/308; 340/561; 328/5
[58] Field of Search .............................. 307/308, 445; 361/179–181; 340/551, 561, 562; 328/5

[56] References Cited

U.S. PATENT DOCUMENTS 4,135,124 1/1979 Buck ....................................... 328/5

FOREIGN PATENT DOCUMENTS 2931880 10/1980 Fed. Rep. of Germany .
2931879 8/1981 Fed. Rep. of Germany .

Primary Examiner—Stanley D. Miller
Assistant Examiner—B. P. Davis
Attorney, Agent, or Firm—Karl F. Ross; Herbert Dubno

[57] ABSTRACT

A contactless motion detector is energized from a source of current via a pair of supply leads and delivers an output signal by way of a further lead through an Exclusive-OR gate to a control electrode of a binary electronic switch in circuit with the source and a load to modify the flow of load current upon the approach of a metallic element, for example. The Exclusive-OR gate, having one input connected to that further lead, has another input connected to an ancillary lead which in turn is connected to the other supply lead through a decoupling diode. A selector switch enables completion of the load circuit directly via the latter supply lead, thereby causing inverted transmission of the output signal of the detector to the control electrode, or by way of the ancillary lead to prevent the inversion of that output signal, whereby the load current can be either increased or reduced upon the occurrence of the event to be detected.

8 Claims, 3 Drawing Figures

ELECTRONIC MONITORING SYSTEM WITH SELECTIVE SIGNAL INVERSION

FIELD OF THE INVENTION

Our present invention relates to an electronic monitoring system, as used for example in a proximity sensor, wherein a preferably contactless detector, sensitive to an ambient condition, generates a binary output signal which assumes a predetermined value (representing either a logical "one" or a logical "zero") in response to a significant change in that condition, e.g. with the approach of a metallic element, to increase (or decrease) the current flow through a load designed to indicate such change.

BACKGROUND OF THE INVENTION

U.S. Pat. No. 4,135,124 in the name of one of us, Robert Buck, discloses a monitoring system of the type here considered which includes logic circuitry for selectively presetting that system to respond to the occurrence of an ambient condition being sensed, i.e. to a change in the value of a binary signal resulting therefrom, with either an intensification or a reduction of the load current. This is accomplished with the aid of an Exclusive-OR (XOR) gate, of the regular or the negated type, which has a first input provided with switchover means for selectively applying two different voltages to the latter input, either manually or automatically. Depending on the logical value of the applied voltage, the XOR gate transmits either the unmodified binary signal or its logical complement to a control input of an electronic switch such as a thyristor. Thus, the XOR gate acts a selective signal inverter whereby, for example, a mechanical relay controlled by the electronic switch can either open or close a load circuit upon the occurrence of the event being monitored.

It is also known, e.g. from German printed specification Nos. 29 31 879 and 29 31 880 respectively published Feb. 19, 1981 and Oct. 16, 1980, to provide two thyristors controlled by a common detector which includes an oscillator whose output amplitude is modified by the occurrence of the monitored event. The two thyristors are operated in an antivalent mode, one of them being fired at high amplitude and the other being fired at low amplitude. Either thyristor, when conducting, intensifies the energization of a respective load; alternatively, a single load may be connected in circuit with one or the other thyristor so that its energization is either intensified or reduced when the monitored event occurs. The detector, energized by the same source, is not completely short-circuited upon the firing of either thyristor since, as explained in the German description, the conductive thyristor is cut off upon each zero-crossing of the alternating supply voltage and does not fire again until the absolute magnitude of the voltage reaches its conduction threshold.

OBJECT OF THE INVENTION

The object of our present invention is to provide a monitoring system of the general type described in the U.S. patent to Buck in which the selective switchover between current intensification and current reduction, or between opening and closure of a load circuit, is achievable by a modification of the external connection between the sensing device and the load with the aid of a single thyristor or other electronic switch.

SUMMARY OF THE INVENTION

A monitoring system embodying our present invention has a basic structure generally similar to that of the aforementioned Buck U.S. Pat. No. 4,135,124 and others listed therein. Thus, the system comprises detector means sensitive to an ambient condition for generating on an output lead a binary signal assuming a predetermined value in response to a significant change in that ambient condition, the detector means preferably including an oscillator working into a trigger amplifier. A voltage-generating network has an incoming lead, an outgoing lead and a common lead, the latter two leads being respectively connected to a pair of power-input terminals of the detector means in order to provide same with the necessary operating current. An electronic switch, e.g. a thyristor or a transistor, is inserted between the incoming and common leads of the voltage-generating network and has a control input connected to an output of an Exclusive-OR gate which has a first input coupled to the output lead of the detector means and a second input connected to an ancillary lead; this second input is also connected by way of resistance means to the outgoing lead of the voltage-generating network for receiving a biasing potential of signal-inverting magnitude therefrom. A utilization circuit, including a source of electrical energy in series with a load, has a first and a second supply terminal, the first supply terminal being connected to the incoming lead of the network. Up to this point, therefore, the system essentially corresponds to that of the prior Buck patent.

Whereas, however, the ancillary lead extending to the second input of the XOR gate is provided in the prior system with a circuit breaker enabling its selective connection to the conductor referred to above as the common lead of the voltage-generating network, that ancillary lead is joined in our present system to the common lead by asymmetrically conductive impedance means while either of these two leads can be selectively connected to the second supply terminal for the completion of an energizing circuit between the source and the detector means. The asymmetrically conductive impedance means may be a diode of the rectifying or the Zener type and, in any event, prevents any significant modification of the biasing potential on the second input of the XOR gate in a first operating position of the switchover means in which the second supply terminal is connected to the common lead; the gate then acts as a signal inverter. In a second operating position of the switchover means, in which the ancillary lead is included in the energizing circuit along with the asymmetrically conductive impedance means, the biasing potential of the second XOR-gate input is changed from one logical value ("1") to the opposite logical value ("0") so that the gate will pass the uncomplemented binary signal from the detector output to the control input of the electronic switch.

Such a circuit arrangement can be used with a source supplying either alternating or direct current. In the first instance, the decoupling diode inserted between the common and ancillary leads may be part of a full-wave rectifier which, advantageously, comprises three pairs of cascaded diodes inserted in parallel between the common and incoming leads of the voltage-generating network, the diodes of the first pair having a junction tied to the first supply terminal while corresponding junctions of the other two diode pairs—one of them including the decoupling diode—are alternately connectable to the second supply terminal by the manually or otherwise operable switchover means.

Naturally, this full-wave rectifier will be omitted when the source is a generator of direct current.

In the embodiments particularly described hereinafter, the common lead (which could be grounded) serves as a negative bus while the incoming lead receives positive voltage from the first supply terminal; these polarities, of course, are given merely by way of example and could be interchanged with proper modification of the circuit components. It should also be noted that the XOR gate may be provided with a negated output as in the prior Buck patent.

BRIEF DESCRIPTION OF THE DRAWING

The above and other features of our invention will now be described in detail with reference to the accompanying drawing in which.

SPECIFIC DESCRIPTION

Figure 1:
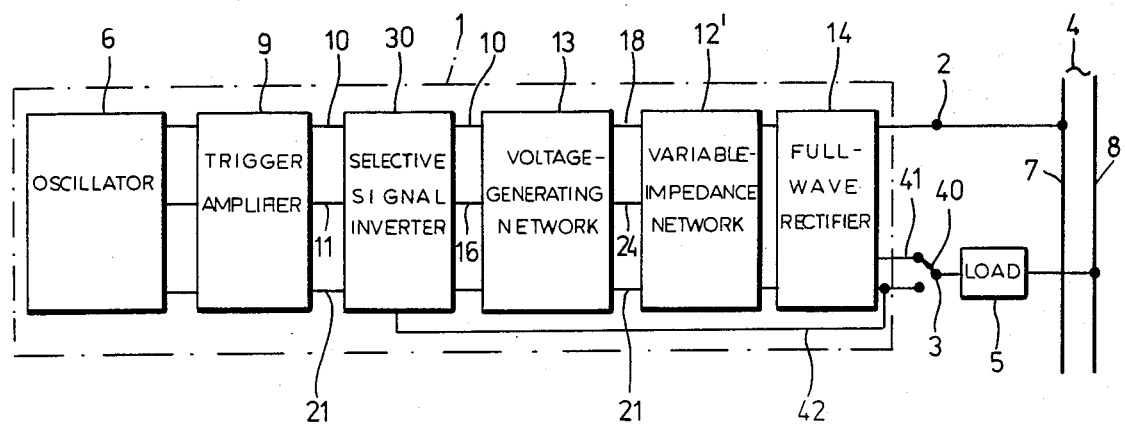
FIG. 1 is a block diagram of an electronic monitoring system with selective signal inversion according to our invention, energized by a source of alternating current.

FIG. 1 shows the basic components of a monitoring system 1 embodying our invention, namely an oscillator 6 and a trigger amplifier 9 together constituting a detector, a current-responsive load 5 such as a relay in a supply circuit whose two terminals 2, 3 are connected via respective conductors 7, 8 across an a-c source 4, a full-wave rectifier 14 inserted between the supply terminals 2, 3 and a pair of leads 18, 21 extending to a variable-impedance network 12' whose impedance controls the load current in response to signals from oscillator 6, and a voltage-generating network 13 also receiving the output of rectifier 14 by way of leads 18 and 21. A selective signal inverter 30 is connected to an output lead 11 of detector 6, 9 and also to supply leads 10, 21 serving to energize the detector with direct current. Further leads 16 and 24 extend from signal inverter 30 to network 13 and from the latter to component 12', respectively.

Rectifier 14, in contrast to its counterpart shown in the prior Buck patent, has two conductors 41 and 42 which are selectively connectable to load 5—and thus to the utilization circuit further including source 4 and conductors 7, 8—via a switch 40 tied to supply terminal 3. Conductor 42, which represents the above-discussed ancillary lead, further extends to signal inverter 30 in a manner more fully described hereinafter with reference to FIG. 2. Conductors 10 and 18 respectively constitute the outgoing and incoming leads of network 13 whose common lead is the conductor 21.

Figure 2:
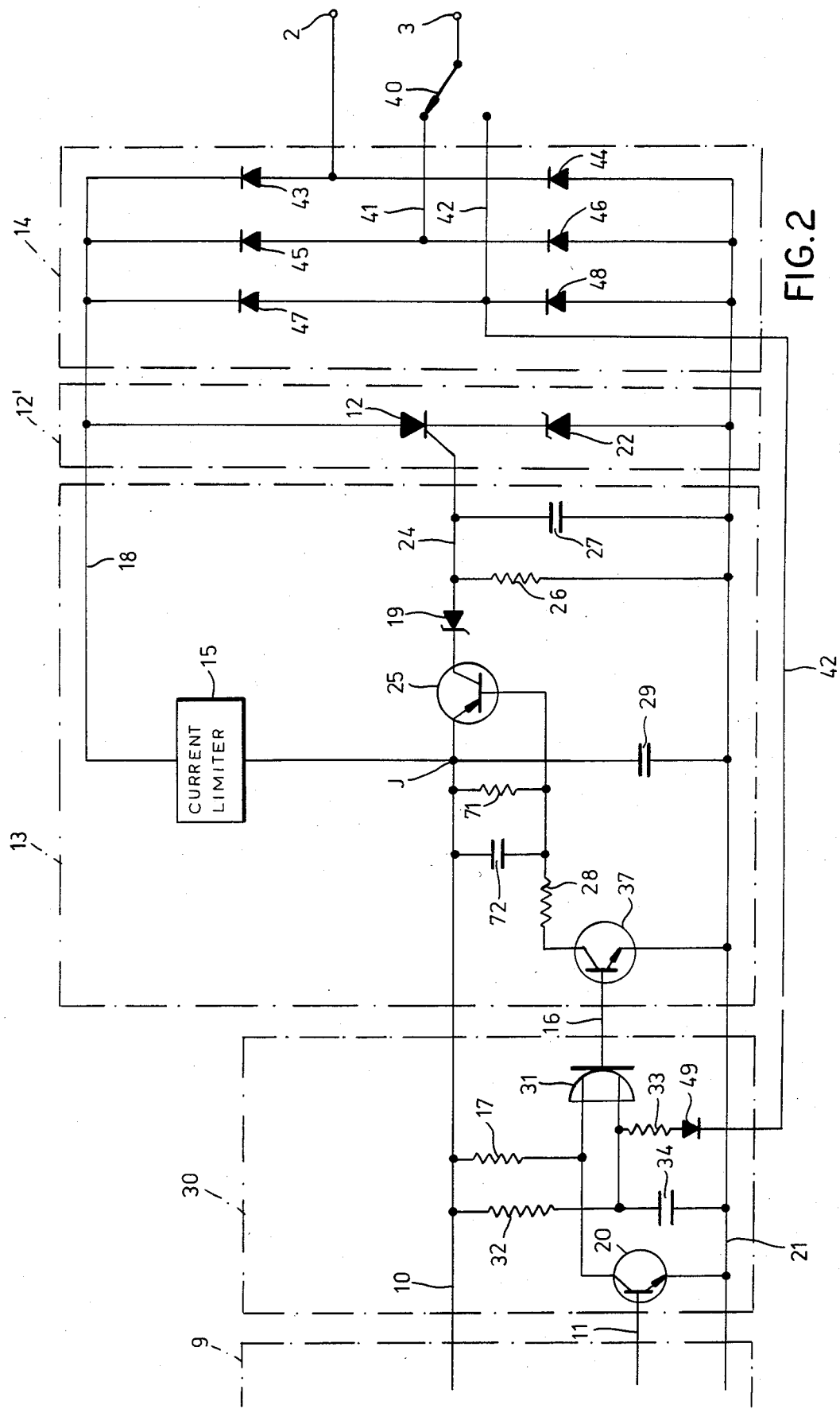
FIG. 2 is a more detailed circuit diagram of certain components of the system of FIG. 1.

FIG. 2 shows details of components 30, 13, 12' and 14. The structure of network 13 is similar to that shown in prior U.S. Pat. No. 4,193,023, in the names of Robert Buck and Gerd Marhofer, to which reference may be made especially as concerns a possible structure for a current limiter 15 inserted in series with a capacitor 29 between the incoming lead 18 and the common lead 21 of that network. Thus, the network includes a PNP transistor 25 having its emitter tied to the junction J of current limiter 15 with capacitor 29 and having its collector connected via a Zener diode 19 and a resistor 26 to lead 21 constituting a negative bus. Lead 24 extends from the junction of Zener diode 19 with resistor 26 to the gate of a thyristor 12 which is the essential element of network 12' and lies between positive and negative buses 18 and 21 in series with a Zener diode 22; the latter (also shown in Buck U.S. Pat. No. 4,135,124) establishes a residual voltage fed to current limiter 15 in the conductive condition of thyristor 12 but is not absolutely essential, thanks to the fact that the thyristor never fully short-circuits the current limiter for the reasons discussed in connection with the two German publications referred to above. Capacitor 29, furthermore, stores the operating voltage supplied via lead 10, extending from junction J, to the motion detector represented by stages 6 and 9 of FIG. 1. Another capacitor 27 shunts the resistor 26 to absorb spurious voltage transients which could cause untimely conduction of thyristor 12.

A PNP transistor 37 has its emitter tied to lead 21 and has its collector connected via a resistor 28 to the base of transistor 25 whose emitter/base circuit is shunted by a resistor 71 and a capacitor 72, again in a manner similar to that shown in the prior Buck/Marhofer patent.

The base of transistor 37 is linked by the lead 16 to the output of an Exclusive-OR gate 31 with a first input connected to the collector of a further NPN transistor 20 whose base receives the output signal of trigger amplifier 9 via lead 11; the collector of transistor 20 is further connected via a resistor 17 to the outgoing lead 10 of network 13, the same as in the prior Buck patent. Another resistor 32, as likewise shown in that prior patent, is connected in series with a capacitor 34 between leads 10 and 21, the junction of impedance 32 and 34 being tied to the second input of XOR gate 31. This second input is further connected to the ancillary lead 42 by way of a resistor 33 in series with a diode 49 poled to prevent the application of positive potential to that input from supply terminal 3 when switch 40 is in its alternate position in which it connects that terminal to the ancillary lead 42. Diode 49, furthermore, is in bucking relationship with another diode 48, inserted between leads 21 and 42, which acts as an asymmetrically conductive impedance decoupling the two leads from each other for negative voltages transmitted in the illustrated position of switch 40 from terminal 3 via lead 41 and a further diode 46 to lead 21. Diodes 46 and 48 lie in cascade with respective diodes 45 and 47 to form two parallel diode pairs inserted between leads 18 and 21 as part of the full-wave rectifier 14 shown in FIG. 1; a further diode pair 43, 44 is similarly inserted in parallel with the other two pairs and has a junction tied to supply terminal 2 Leads 41 and 42 are connected to the junction of diode pairs 45, 46 and 47, 48, respectively.

Thus, diodes 43–46 are active in the illustrated position of switch 40 to form a rectifier bridge with an input diagonal connected across utilization circuit 2–5 (FIG. 1) and an output diagonal connected across buses 18 and 21. In the alternative position of switch 40, diodes 45 and 46 are replaced by diodes 47, 48 to form an analogous bridge circuit. In the first instance, lead 42 floats so that positive potential on outgoing lead 10 is applied via resistors 17 and 32 to both inputs of XOR gate 31 which therefore is nonconductive, cutting off the two cascaded transistors 37 and 25, as long as transistor 20 is cut off by low voltage on the output lead 11 of amplifier 9. When that output voltage goes high and transistor 20 conducts, e.g. upon the approach of an object whose proximity is to be detected, gate 31 opens and turns on the transistors 37 and 25 whereby positive voltage stored on capacitor 72 traverses the Zener diode 19 and triggers the thyristor 12 to intensify the load current drawn through rectifier 14; this may cause, for example, the closure of a mechanical relay in load 5 (FIG. 1).

When, on the other hand, switch 40 connects supply terminal 3 to ancillary lead 42, the appearance of negative voltage on this lead during alternate half-cycles of the a-c source 4 (FIG. 1) will substantially dissapate the positive charge on capacitor 34 to render the XOR gate 31 conductive when transistor 20 is cut off, i.e. when the output signal of amplifier 9 is low. XOR gate 31, accordingly, acts in this instance as a signal inverter causing, for example, the closure of a relay in load 5 only in the absence of the object whose approach is being monitored.

Figure 3:
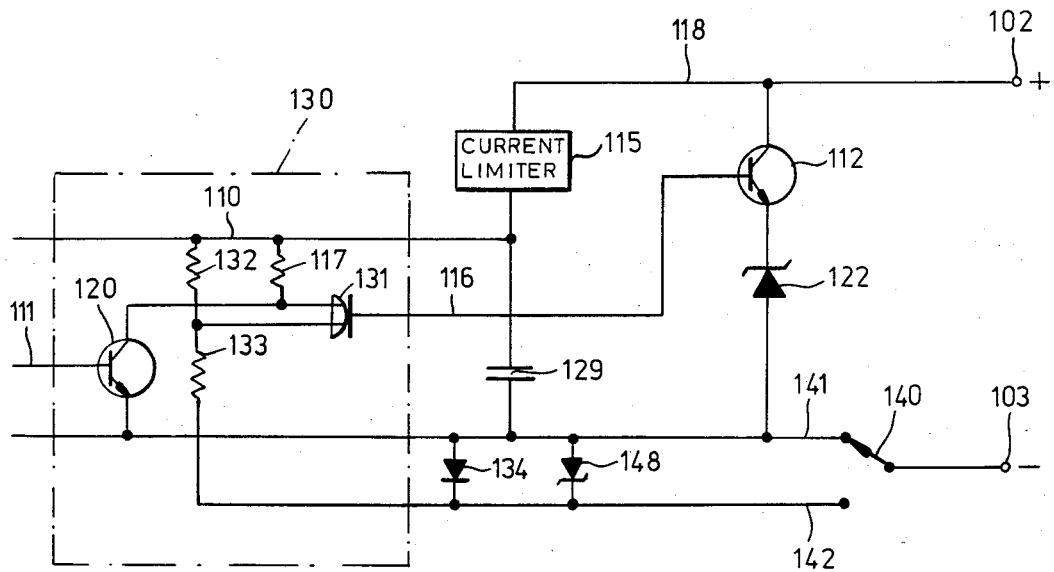
FIG. 3 is a circuit diagram relating to a modified system energized by a source of direct current.

In FIG. 3 we have shown a modification of the circuit arrangement of FIG. 2 applicable to a situation in which the nonillustrated load lies in cascade with a direct-current source to form a utilization circuit connected across a positive supply terminal 102 and a negative supply terminal 103; terminal 102 is connected to a bus 118. A switch 140 selectively connects terminal lead 103 to a common lead 141 of a voltage-generating network or to an ancillary lead 142, these two leads being interconnected by a Zener diode 148 in parallel with a capacitor 134. Diode 148 is poled to offer little resistance to the flow of operating current from common lead or bus 141 to ancillary lead 142 when selector switch 140 is in its alternate position. An electronic switch 112, shown as an NPN transistor, is connected between leads 118 and 141 in series with a Zener diode 122 which is designed to limit the current flow through that transistor upon conduction thereof in response to a positive control signal applied to its base by a XOR gate 131 via a lead 116, thereby allowing sufficient residual current to pass through a current limiter 115 for maintaining the energization of an associated oscillator and trigger amplifier (corresponding to the detector 6, 9 shown in FIG. 1) via an outgoing lead 110. A binary output signal from that trigger amplifier, appearing on a lead 111, controls the conduction of an NPN transistor 120 in a manner analogous to that described for transistor 20 of FIG. 2; as in the preceding embodiment, the collector of this transistor is connected on the one hand to an input of XOR gate 131 and on the other hand through a resistor 117 to the lead 110 from which two series resistors 132, 133 extend to ancillary lead 142. The second input of gate 131, tied to the juction of resistors 132, 133, is biased positive as long as lead 142 floats, i.e. while selector switch 140 occupies its illustrated position. A capacitor 129 again lies between current limiter 115 and the negative bus here represented by common lead 141.

XOR gate 131 and associated circuit elements form part of a selective signal inverter 130 whose operation, as will be apparent, is analogous to that of circuit 30 shown in FIG. 2.

The combination of transistor 112 with Zener diode 122 is representative of a variety of electronic switching circuits, operable by continuous direct current (rather than pulsating one as in FIG. 3) which are the subject matter of a copending application concurrently filed by us jointly with Peter Spaehn under Ser. No. 487,122, filed April 21, 1983 whose disclosure is hereby incorporated by reference into our present application.

While FIG. 1 shows the current source connected to the selector switch 40 by way of the load 5, it will be understood that the positions of the source and the load in the utilization circuit could be interchanged.

As used in the appended claims, the term "output lead of the detector" refers not to the lead 11 or 111 but rather to the collector lead of transistor 12 or 120 which invariably inverts the actual detector signal. Furthermore, while this signal has been referred to as binary, it will be understood that this term is meant to allow for certain voltage variations on opposite sides of a threshold at which XOR gate 31 or 131 changes its state of conduction.

We claim:

1. An electronic monitoring system comprising:
   detector means sensitive to an ambient condition for generating on an output lead a binary signal assuming a predetermined value in response to a significant change in said ambient condition, said detector means being provided with a pair of power-input terminals;
   a voltage-generating network provided with an incoming lead, an outgoing lead and a common lead, said outgoing and common leads being respectively connected to said power-input terminals;
   an electronic switch inserted between said incoming and common leads;
   an Exclusive-OR gate having a first input coupled to said output lead and a second input connected to an ancillary lead, said Exclusive-OR gate having an output connected to a control input of said switch;
   resistance means connecting said second outgoing lead to said second input for applying a signal-inverting biasing potential thereto;
   a utilization circuit including a source of electrical energy in series with a load, said utilization circuit having a first supply terminal connected to said incoming lead and further having a second supply terminal;
   switchover means selectively operable for alternatively connecting said second supply terminal to said common lead in a first operating position and to said ancillary lead in a second operating position; and
   asymmetrically conductive impedance means joining said common lead to said ancillary lead for enabling said source to energize said detector means by way of said load in both said operating positions while preventing any significant modification of said biasing potential on said second input in said first operating position but causing such modification in said second operating position whereby said Exclusive-OR gate transmits to said control input the logical complement of said binary signal in said first operating position and the uncomplemented binary signal in said second operating position, conduction of said switch under the control of said Exclusive-OR gate intensifying the current supplied by said source to said load in each of said operating positions.

2. A system as defined in claim 1 wherein said asymmetrically conductive impedance means comprises a decoupling diode.

3. A system as defined in claim 2 wherein said source is a generator of alternating current, said decoupling diode being part of a full-wave rectifier further including a pair of cascaded diodes inserted between said incoming and common leads with a junction connected to said first terminal.

4. A system as defined in claim 3 wherein said full-wave rectifier includes a second and a third pair of cascaded diodes inserted in parallel with the first-mentioned pair between said incoming and common leads, said decoupling diode being part of said third pair whose junction is connected to said ancillary lead, said second terminal being selectively connectable by said switchover means to the junction of said second and third pairs.

5. A system as defined in claim 3 wherein said ancillary lead includes a blocking diode in bucking relationship with said decoupling diode.

6. A system as defined in claim 5, further comprising capacitive means coupling said ancillary lead to said common lead, said blocking diode being interposed in series with a resistor between said capacitive means and said decoupling diode.

7. A system as defined in claim 2 wherein said source is a generator of direct current.

8. A system as defined in claim 7 wherein said decoupling diode is a Zener diode.

* * * * *